United States Patent
Trummer

(10) Patent No.: US 11,552,379 B2
(45) Date of Patent: Jan. 10, 2023

(54) TRANSITION FROM A STRIPLINE TO A WAVEGUIDE

(71) Applicant: ASTYX GmbH, Ottobrunn (DE)

(72) Inventor: Stefan Trummer, Oberhaching (DE)

(73) Assignee: CRUISE MUNICH GMBH, Ottobrunn (DE)

( * ) Notice: Subject to any disclaimer, the term of this patent is extended or adjusted under 35 U.S.C. 154(b) by 0 days.

(21) Appl. No.: 16/640,782

(22) PCT Filed: Aug. 20, 2018

(86) PCT No.: PCT/EP2018/072450
§ 371 (c)(1),
(2) Date: Feb. 21, 2020

(87) PCT Pub. No.: WO2019/038236
PCT Pub. Date: Feb. 28, 2019

(65) Prior Publication Data
US 2021/0036394 A1    Feb. 4, 2021

(30) Foreign Application Priority Data
Aug. 24, 2017   (DE) ..................... 10 2017 214 871.3

(51) Int. Cl.
*H01P 5/08*    (2006.01)
*H01P 3/08*    (2006.01)
(Continued)

(52) U.S. Cl.
CPC .................. *H01P 5/08* (2013.01); *H01P 3/08* (2013.01); *H01P 3/12* (2013.01); *H05K 1/0237* (2013.01); *H05K 1/115* (2013.01)

(58) Field of Classification Search
CPC ..... H01P 5/08; H01P 3/08; H01P 3/12; H05K 1/0237; H05K 1/115
See application file for complete search history.

(56) References Cited

U.S. PATENT DOCUMENTS 5,408,188 A * 4/1995 Katoh ................ G01R 1/06772
324/756.03
6,265,950 B1 * 7/2001 Schmidt .................. H01P 5/107
333/26

(Continued)

FOREIGN PATENT DOCUMENTS

CN    201266665 Y    7/2009
CN    101589654 A    11/2009
(Continued)

OTHER PUBLICATIONS

DE Search Report in German Appln. No. 102017214871.3, dated Jun. 30, 2018, 10 pages (with English Translation).
(Continued)

*Primary Examiner* — Samuel S Outten
(74) *Attorney, Agent, or Firm* — Calfee, Halter & Griswold LLP

(57) ABSTRACT

The invention relates to a transition from a stripline to a waveguide, wherein: the stripline, preferably a microstrip line, is located on a substrate; an upper side of the substrate has a metallised surface and the lower side of the substrate has a metal layer, preferably a high-frequency ground-potential layer; the upper side and the lower side are connected to vias; and at least part of the metallised surface on the upper side of the substrate acts as a waveguide wall.

9 Claims, 5 Drawing Sheets

Transition between microstrip line and waveguide

(51) Int. Cl.
*H01P 3/12* (2006.01)
*H05K 1/02* (2006.01)
*H05K 1/11* (2006.01)

(56) References Cited

U.S. PATENT DOCUMENTS

| | | |
|---|---|---|
| 2002/0097108 A1 | 7/2002 | Jain |
| 2002/0163397 A1 | 11/2002 | Buck |
| 2006/0145777 A1 | 7/2006 | Mueller |
| 2011/0267152 A1* | 11/2011 | Lee .................. H01P 5/103 333/26 |
| 2016/0336282 A1 | 11/2016 | Dang et al. |
| 2019/0348740 A1* | 11/2019 | Seo .................. H01P 5/1022 |

FOREIGN PATENT DOCUMENTS

| | | |
|---|---|---|
| CN | 101677145 A | 3/2010 |
| CN | 102074772 A | 5/2011 |
| CN | 105580195 A | 5/2016 |
| DE | 19636890 | 2/1998 |
| DE | 19725492 | 8/1998 |
| DE | 10243 671 | 3/2004 |
| DE | 102015225496 | 6/2017 |
| JP | H05 273234 | 10/1993 |

OTHER PUBLICATIONS

Mueller et al., "Surface-mountable Metalized Plastic Waveguide Filter Suitable for High Volume Production," 33rd European Microwave Conference, Munich, Germany, 2003; 33rd IEEE, Piscataway, NJ, USA, Oct. 1, 2003, pp. 1255-1258.

PCT International Preliminary Report on Patentability in International Appln. No. PCT/EP2018/072450, dated Feb. 25, 2020, 10 pages.

PCT International Search Report and Written Opinion in International Appln. No. PCT/EP2018/072450, dated Oct. 29, 2018, 11 pages.

* cited by examiner

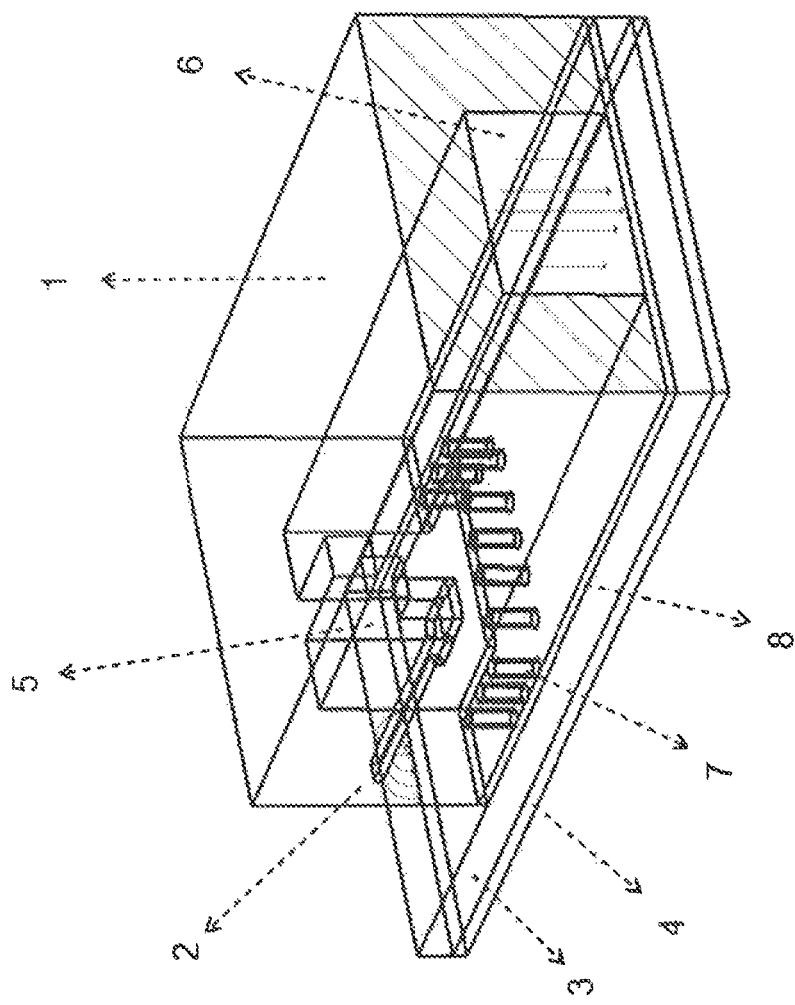
Fig. 1: Transition between microstrip line and waveguide

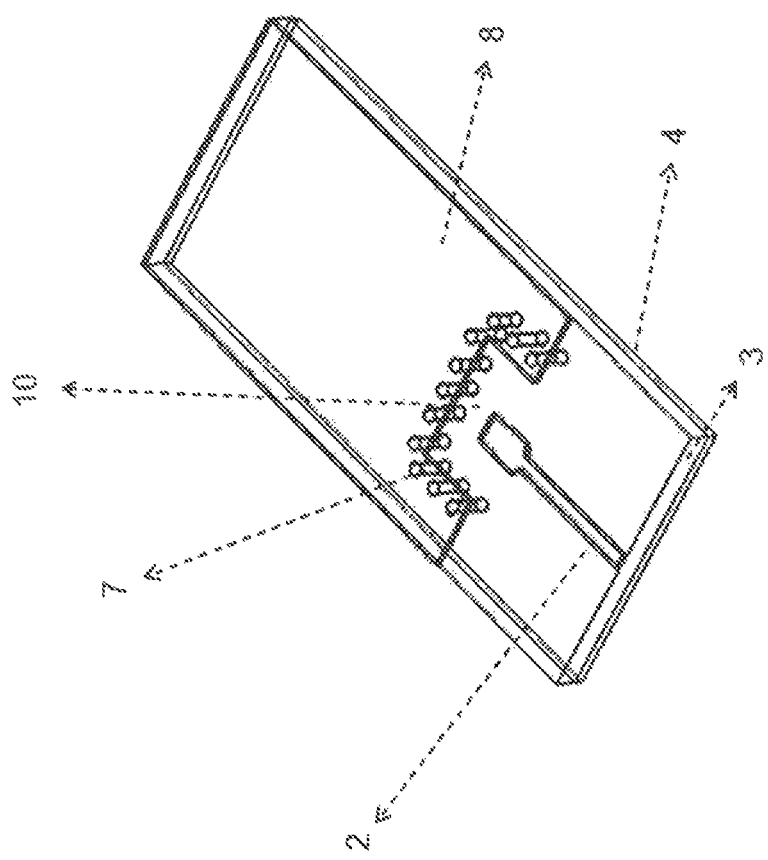
Fig. 2. Components of the transition

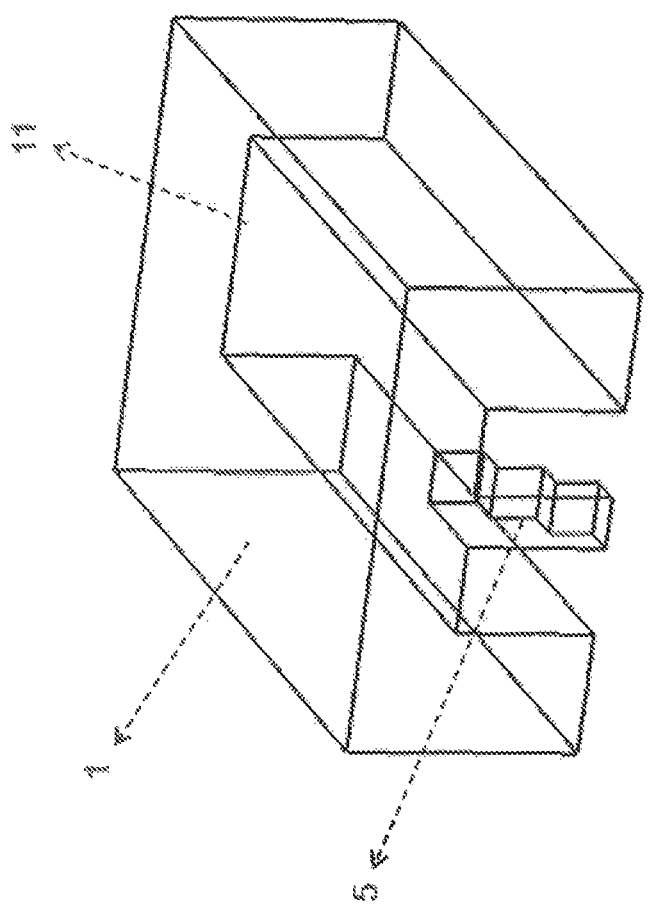
Fig. 3: Components of the transition

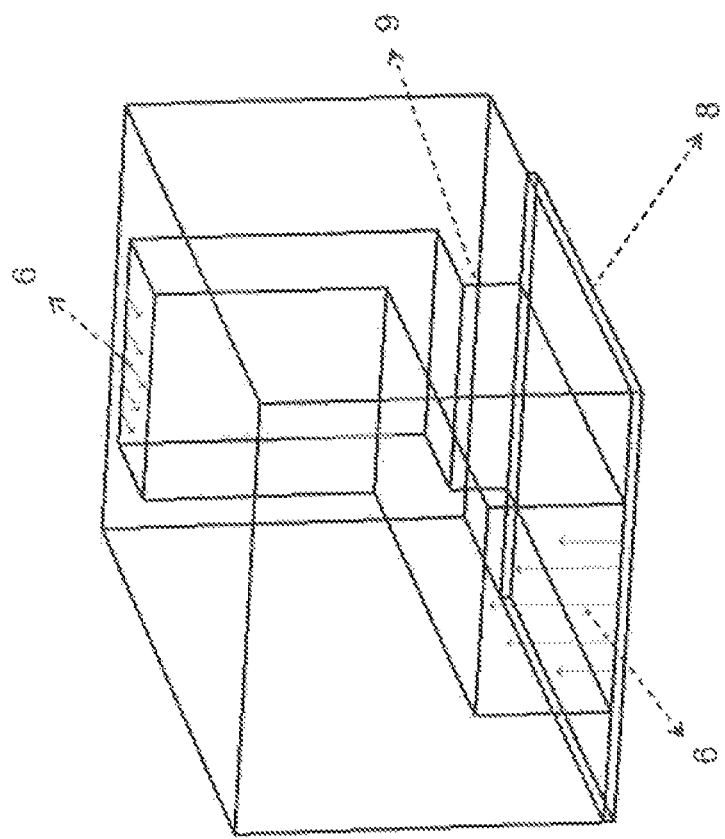
Fig. 4: Further guidance of the waveguide wave in the block

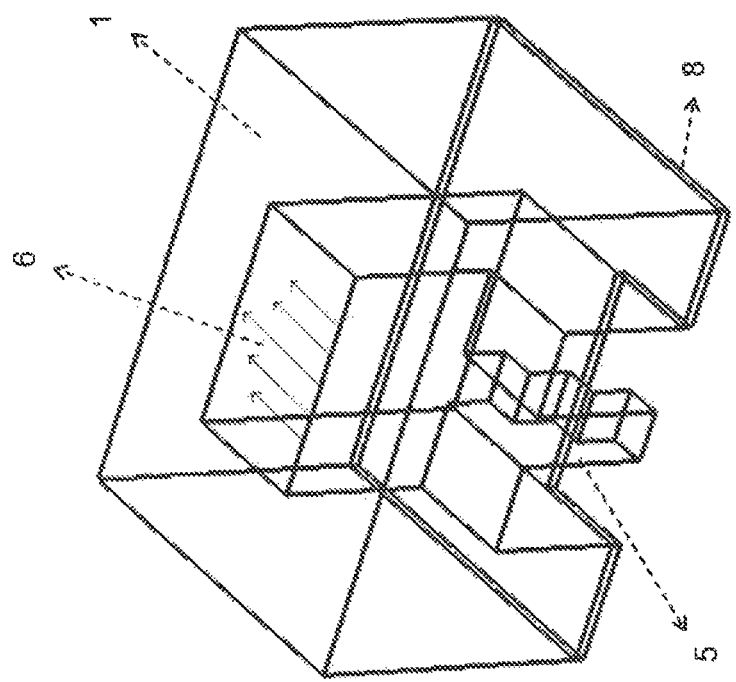
Fig. 5. Compact construction of the transition

TRANSITION FROM A STRIPLINE TO A WAVEGUIDE

CROSS REFERENCE TO RELATED APPLICATIONS

This application is a National Phase entry of International Patent Application No. PCT/EP2018/072450, filed on Aug. 20, 2018, which claims priority to Application No. DE 10 2017 214 871.3, filed on Aug. 24, 2017, the disclosures of which are hereby incorporated by reference in their entireties.

The present invention relates to a transition from a stripline to a waveguide. The transition is implemented by virtue of the fact that the stripline is situated on a substrate, wherein a top side of the substrate has a metallized surface and the underside of the substrate has a metal layer, wherein the top side and the underside are connected to vias, wherein the metallized surface on the top side of the substrate at least partly functions as a waveguide wall.

Increased requirements made of sensor technology as provided in the field of radar, for example, owing to the objective of autonomous driving are giving rise to new challenges in sensor development. These increased demands have to be taken into account here primarily in the case of the antennas of the sensors, since these have a crucial influence on the overall system. In this case, planar antennas situated on printed circuit boards, these antennas frequently being used at the present time, are often no longer able to provide the necessary power. Therefore, waveguide antennas are increasingly being used. Since other sensor components, such as receiver and transmission chips, for example, are still situated on printed circuit boards, suitable transitions between waveguiding elements on printed circuit boards and waveguiding elements in a waveguide are crucial components of many new sensor systems.

The document DE 196 36 890 C1 describes a method that includes contacting a stripline with a web situated in the waveguide. In this case, the contacting of the waveguide walls is effected both above and below the substrate. However, this principle has the serious disadvantage that such transitions can be situated only at the edge of a substrate.

On account of the increased requirements made of the sensor systems, in the future it will be necessary to distribute transitions on the substrate.

It is therefore an object of the present invention to provide a transition from a stripline to a waveguide which eliminates or reduces the disadvantages present in the prior art and realizes required line routing.

The stated object is achieved in accordance with the features of independent patent claim 1 in that the stripline is situated on a substrate, wherein a top side of the substrate has a metallized surface and the underside of the substrate has a metal layer, wherein the top side and the underside are connected to vias, wherein the metallized surface on the top side of the substrate at least partly functions as a waveguide wall.

One advantage here is that the transitions can be realized flexibly at any desired locations on a substrate, with the result that required line routings are achieved. A further advantage is that an optimized construction and an improved power are realized.

Preferred or advantageous embodiments of the invention are evident from the dependent claims, the following description and also the accompanying figures.

Preferably, the stripline is contacted by a steplike structure connected to the waveguide, preferably in the vicinity of the metallized surface on the top side of the substrate.

Preferably, the structure is situated within a block that consists of metal or is metallized, and the block has a plurality of waveguide structures, wherein at least a plurality of vias, preferably directly, contact the block in a transition region.

Preferably, the block has a rectangular waveguide in which an electrical wave propagates, wherein the waveguide wave is guided further within the block by means of a 90° bend, such that the metallized surface on the top side of the substrate functions as a waveguide wall only in the transition region.

The 90° bend is preferably situated perpendicular to the substrate.

Preferably, the block has a plurality of layers produced by means of milling technology and/or 3D printing technology and/or plastic injection-molding methods. Furthermore, a transition can be produced by means of an embossing or diecasting or cold flow process with subsequent metallization.

Preferably, the stripline ends at the location at which it is contacted by the structure connected to the waveguide.

The block usually consists of metal or of some other material which is metallized, and can be produced in different layers connected to one another. The necessary design criteria such as adding radii and drafts or possible design criteria can be provided without any problems for the block. Furthermore, the steplike contact structure can also be embodied in the form of one or more chamfers.

Further features, advantages and effects of the invention are evident from the following description of exemplary embodiments and the accompanying figures, in which:

FIG. 1 shows a basic construction of a transition;

FIG. 2 shows components of a transition which are situated directly at a substrate;

FIG. 3 shows components of a transition which are situated within a block;

FIG. 4 shows exemplary further guidance of the waveguide wave in a block; and

FIG. 5 shows a compact embodiment of a transition, illustrating exclusively a block with a waveguide structure and a ground surface on a substrate.

FIG. 1 shows a basic construction of a transition, consisting of a microstrip line. The microstrip line 2 is situated on a substrate 3. A layer 4 at radio-frequency ground potential is situated below the substrate. The known fundamental mode of the microstrip line 2, a so-called quasi-transverse electromagnetic (quasi-TEM) mode, thus forms. The microstrip line 2 is then contacted by a steplike structure 5. The microstrip line mode is thus transformed to an H10 rectangular waveguide mode 6. The steplike contact structure 5 is situated within a block 1 that includes all the waveguide structures. The contact structure 5 is connected to a waveguide wall. The transition in accordance with FIG. 1 thus consists of:

a block 1 having waveguide structures,
a rectangular waveguide 6 with H10 wave,
a metallized surface 8 on the substrate,
vias 7,
a layer 4 at ground potential,
a substrate 3,
a microstrip line 2 with wave in the fundamental mode, and
a steplike structure 5 that contacts the microstrip line.

The radio-frequency ground potential required for the microstrip line mode is transferred from a metal layer on the underside of the substrate to the metallized surface on the top side of the substrate by virtue of the fact that both surfaces are connected to vias in the region of the steplike contact structure. In this case, the metallized surface on the substrate partly functions as a wall of the waveguide. The other waveguide walls are situated in the block. They obtain their radio-frequency ground potential by virtue of the fact that some vias that transfer the ground potential directly contact the block in the transition region. This construction ensures that transitions can be realized flexibly at any desired locations on the substrate.

FIG. 2 shows the components of a transition which are situated directly at the substrate 3. Said components are the microstrip line 2, a metallized surface 8 on the substrate, and a layer 4 at ground potential below the substrate 3. In this case, the microstrip line 2 has a widened portion at its end. The metallized surface 8 on the substrate begins shortly before the end of the microstrip line, wherein a surface having no metallization is situated between the metallized surface and the end of the microstrip line. This region is referred to as a cutout 10 of the metallized surface. Along said cutout 10, the metallized surface 8 on the substrate 3 is connected to a layer 4 at ground potential situated below the substrate 3, by means of vias 7.

FIG. 3 shows a block 1 having a waveguide structure, said block being situated above the substrate. Said block has a rectangular, downwardly open cutout 11, in the transverse center of which the steplike contact structure 5 is situated at the beginning of the cutout. Said contact structure consists of preferably three steps, wherein the structure increases in length to an upper waveguide wall of the rectangular waveguide in the longitudinal direction of the waveguide. In this case, the bottommost of the three steps contacts the microstrip line 2. Regions of the block which contact the vias on the metallized surface on the substrate are furthermore identified. The steplike contact structure consists of preferably three steps, but it can also consist of any desired number of steps.

In the rear region of the block or on the remote side of the contact structure, a rectangular waveguide is obtained in the rectangular cutout 11, in which a transverse electrical wave, a TE10 wave, propagates. The rectangular waveguide is bounded from three sides by the cutout and from the bottom by the metallized surface on the substrate. Since the transition is intended to occupy only a small space on the substrate, it is necessary for the waveguide wave to be guided further completely within the block.

FIG. 4 shows exemplary further guidance of the waveguide wave in a block. By means of a 90° bend of the waveguide having a step 9, the wave can be guided exclusively in a block. On the remote side of the step in the waveguide, a metallized surface is no longer required on the substrate. Before the step in the waveguide, however, there is a metallized surface 8 on the substrate. FIG. 4 thus illustrates the further guidance of the waveguide wave in the block by means of rectangular waveguide 6 with H10 wave in the front and rear regions of the block, wherein the front region of the block has a metallized surface 8 on the substrate, and a step in the waveguide 9 leads to the rear region.

FIG. 5 shows a very compact embodiment of a transition, illustrating a block 1 having a waveguide structure, a metallized surface 8 on the substrate 3, a steplike contact structure, and a rectangular waveguide with H10 wave. In this case, the other components of the transition, such as the microstrip line 2, the vias 7, the substrate 3 and the ground potential 4 below the substrate, are maintained in their arrangement in accordance with FIG. 1. The compact variant is distinguished by the fact that the 90° bend is situated in the rear region of the block or directly on the remote side of the steplike contact structure 5. The step in the waveguide 9 as shown in FIG. 4 is not necessarily essential in the case of the compact construction in accordance with FIG. 5.

LIST OF REFERENCE SIGNS

1 Block having waveguide structures
2 Microstrip line with wave in the fundamental mode
3 Substrate
4 Layer at ground potential
5 Steplike contact structure
6 Rectangular waveguide with H10 wave
7 Vias
8 Metallized surface on the substrate
9 Step in the waveguide
10 Cutout of the metallized surface
11 Rectangular cutout

The invention claimed is:

1. A device comprising:
  a microstrip line situated on a substrate, wherein the substrate has a top side and an underside, wherein the top side of the substrate has a metallized surface and the underside of the substrate has a metal layer, wherein the microstrip line is situated on the top side of the substrate;
  a waveguide that is positioned on the top side of the substrate, wherein the waveguide propagates an electromagnetic wave; and
  a multi-step structure that is in contact with the microstrip line and is further connected to the waveguide,
  wherein the metallized surface of the top side of the substrate and the metal layer of the underside are connected to one another by way of vias in a transition region of the device,
  wherein the metalized surface on the top side of the substrate functions as a waveguide wall only in the transition region, and
  wherein the waveguide has a 90° bend situated directly on a remote side of the multi-step structure.

2. The device as claimed in claim 1, wherein the multi-step structure comprises three steps.

3. The device as claimed in claim 2, wherein a block includes the waveguide and the multi-step structure, wherein the block includes a cutout that faces the top side of the substrate, and further wherein the waveguide is positioned within the cutout such that metallized surfaces of the cutout at least partially form walls of the waveguide.

4. The device as claimed in claim 3, wherein the waveguide is rectangular, and
  wherein the device is configured, during operation, to guide the electromagnetic wave further within the block through the 90° bend.

5. The device as claimed in claim 4, wherein the 90° bend is situated perpendicular to the substrate.

6. The device as claimed in claim 3, wherein the block comprises a plurality of milled layers, 3D printed layers, and/or plastic injection-molded layers.

7. The device as claimed in claim 3, further comprising a plurality of vias that contact the block in a transition region from the microstrip line to the waveguide.

8. The device as claimed in claim 3, wherein the multi-step structure extends from a wall of the cutout that opposes the top side of the substrate to the top side of the substrate.

9. The device as claimed in claim 1, wherein the metal layer comprises a radio frequency ground potential layer.

\* \* \* \* \*